United States Patent [19]
Sasaki et al.

[11] Patent Number: 5,172,044
[45] Date of Patent: Dec. 15, 1992

[54] MULTI-RATE CONSTANT VOLTAGE BATTERY CHARGER WITH DISPLAY

[75] Inventors: Masayoshi Sasaki; Koji Umetsu, both of Miyagi; Tsugio Sameshima, Chiba, all of Japan

[73] Assignee: Sony Corporation, Tokyo, Japan

[21] Appl. No.: 660,001

[22] Filed: Feb. 25, 1991

[30] Foreign Application Priority Data

Feb. 27, 1990 [JP] Japan .................................. 2-46812
Feb. 27, 1990 [JP] Japan .................................. 2-46814

[51] Int. Cl.⁵ .............................................. H02J 7/00
[52] U.S. Cl. ....................................... 320/22; 320/32; 320/39; 320/48
[58] Field of Search ................. 320/43, 44, 32, 48, 320/22, 32, 39

[56] References Cited

U.S. PATENT DOCUMENTS

| | | |
|---|---|---|
| 3,854,082 | 12/1974 | Nasby et al. .......................... 320/22 |
| 4,125,802 | 11/1978 | Godard .............................. 320/22 X |
| 4,418,310 | 11/1983 | Bollinger .............................. 320/39 |
| 4,629,965 | 12/1986 | Fallon et al. ........................ 320/32 X |
| 4,678,998 | 7/1987 | Muramatsu et al. ............. 320/48 X |
| 4,680,528 | 7/1987 | Mikami et al. ....................... 320/32 |
| 4,918,368 | 4/1990 | Baker et al. ...................... 320/22 X |

Primary Examiner—R. J. Hickey
Attorney, Agent, or Firm—Lewis H. Eslinger; Jay H. Maioli

[57] ABSTRACT

A voltage setting value for charging a battery starts from a first constant voltage level less than a full battery voltage and after a period of time the battery voltage reaches that first level and the charging current begins to decrease. The charging current decrease is detected and the voltage value is increased to a next constant voltage level and the process is repeated until the constant voltage level is reached that equals the full battery voltage. Each time the voltage level is changed the corresponding percentage of the battery voltage is displayed to represent the charging amount.

6 Claims, 14 Drawing Sheets

MULTI-RATE CONSTANT VOLTAGE BATTERY CHARGER WITH DISPLAY

BACKGROUND OF THE INVENTION

1. Field of the Invention

The present invention generally relates to charging amount display apparatus and, more particularly, is directed to an apparatus for displaying a charge amount of a re-chargeable battery, such as a lead storage battery or the like.

2. Description of the Prior Art

Conventionally, in a charging apparatus for charging a secondary battery, such as a lead storage battery, a charging current of the secondary battery is detected and a charging amount is displayed in order to display the charged condition of the secondary battery. However, in such secondary battery, as shown by a charging voltage characteristic curve 20 in FIG. 1, after a predetermined period of time, the charging voltage is placed in a saturated condition 20a before the charging amount reaches to the fully charged state (100%) as shown by a charging amount characteristic curve 21 so that, even when the charging voltage is detected, if the charging voltage is less than a predetermined voltage, then the charging condition cannot be displayed. That is, in the ordinary charging apparatus, only about 70 to 80% of the charging condition is displayed. To solve this problem, as shown in FIG. 1, when the charging voltage approaches the saturated condition 20a, a charging current characteristic curve 22 which is constant up to that time begins to decrease, and for this reason, a decreasing charging current 22a is detected in order to display the charging condition. FIG. 2 shows an example of an arrangement of a conventional charging amount display apparatus.

Referring to FIG. 2, an AC power source voltage from an AC plug 1 which is inserted into a commercially available AC power supply source is filtered out by a filter section 2 and fed to a switching section 3. A switch timing of the switching section 3 is controlled by a control signal which results from converting control data of a microcomputer (hereinafter referred to as a central processing unit (CPU)) 10A into an analog signal. A switching signal, which is controlled to have a predetermined pulse width by the switching section 3, is supplied to a primary side of a conversion transformer 4, and an increasing voltage (decreasing voltage) conversion signal developed at the secondary side of the conversion transformer 4 is rectified and smoothed by a rectifying and smoothing circuit 5, converted into a DC voltage and is then fed to a positive terminal 13 to which an anode terminal of a secondary battery 12 to be charged is connected. A negative terminal 14 is connected with a cathode terminal of the secondary battery 12 and also with one end of a charging current detection resistor 15 and the other end of this resistor 15 is grounded. A charging voltage detecting circuit 19 is connected to the positive terminal 13 while a charging current detecting circuit 18 is connected to the negative terminal 14, whereby the charging voltage and the charging current detected by the two detecting circuits 19 and 18 are converted to digital data by analog-to-digital (A/D) converter circuits 17 and 16 respectively and charging voltage data and charging current data are supplied to the CPU 10A. The CPU 10A generates data corresponding to the charging voltage or charging current and supplies the same to similarly two digital-to-analog (D/A) converter circuits not shown. By outputs of these D/A converter circuits, the switching section 3 is controlled and a charging state is displayed on a display section 11.

According to the prior-art charging amount display apparatus shown in FIG. 2, when the secondary battery 12 is charged, during the charging voltage characteristic curve 20 shown in FIG. 1 is increased, the charging voltage is detected by the charging voltage detecting circuit 19 to thereby control the switching section 3. Under the condition that the charging voltage becomes constant, the charging current 22a in which the charging current characteristic curve 22 shown in FIG. 1 is decreased is detected by the charging current detecting circuit 18 to thereby control the switching section 3. As a consequence, when the switching section 3 is controlled by the CPU 10A or the like, not only the two A/D converter circuits 16 and 17 and the two D/A converter circuits are needed but also the charging current detecting circuit 18 and the charging voltage detecting circuit 19 are needed, which provides a complicated circuit arrangement of the charging amount display apparatus.

Further, in a re-chargeable secondary battery and so on, when a charging amount in the charging-process of the secondary battery is measured, if a correlation shown by a characteristic curve 30 in FIG. 3 is established between a secondary battery release voltage (V) and a charging amount (%), then the charging amount of the secondary battery can be detected by measuring release voltages V1, V2, ..., V4 of the secondary battery. As shown in a circuit diagram of FIG. 4A, when a secondary battery 42 to be charged is connected through a switching means 32 to an output terminal of a battery charger 31 having a plug 41 which is inserted into an commercially available AC power source and a release voltage of the secondary battery 42 in the charging-process is measured, the switching means 32 is turned OFF and the release voltage of the secondary battery 42 is measured by using a voltmeter 33 or the like. Generally, when the secondary battery 42 is rapidly charged, a constant current charging is performed and a charging current of, for example, a relatively large current value of 1A to 2A is supplied to the secondary battery 42. Therefore, a large current switch is required as the switching means 32 which turns ON and OFF this large current, and such large current switch increases a manufacturing cost of the charging amount display apparatus and also deteriorates reliability thereof.

Furthermore, a voltage drop occurs due to an interconnection resistance and a contact resistance between the battery charger 31 and the secondary battery 42, and an inside resistance of the secondary battery 42, when it is rapidly charged by the large current. Particularly, in a video camera or the like in which a secondary battery is housed in a housing and treated as one of video camera accessories, positive and negative polarity terminals of secondary battery in the mounting and/or dismounting process are formed as contact structures, and the secondary battery is connected to the battery charger 31 by means of the contact structures. Although a contact resistance of that contact structure is usually in a range of from about 50 mΩ to 100 mΩ, if the secondary battery is connected to and disconnected from the battery charger repeatedly, the contact resistance is changed to about 200 mΩ. More specifically, the contact resistance is changed each time the secondary battery is connected to and disconnected from the battery charger, and the amount of the change of release voltage of the secondary battery in the charging-process is 0.4 V if the charging current is 2 A and the contact resistance is 200 mΩ. If the charging current is 2 A and the contact resistance is 100 mΩ, the amount of the change of the release voltage is 0.2 V, and thus, the amount of the change of the voltage is increased. More precisely, as shown by a graph of charging characteristic curves of FIG. 5, a difference of voltage occurs between a battery voltage characteristic curve 45 in the rapid charging process and a secondary battery release voltage characteristic curve 46 as shown by a broken line 46. In FIG. 5, reference numeral 47 designates a charging current characteristic curve of the rapid charging process. If the release voltage is detected by the aforementioned method of FIG. 4A without being affected by the change of the voltage of the release voltage as described above, then unavoidably the switching means 32 of large capacity must be provided to cause the earlier noted disadvantages.

To solve such problem, as shown in FIG. 4B, a plurality of contacts 43, 44, 43a and 44a are provided in a housing 48 which houses the secondary battery 42, and the secondary battery 42 is connected between the contacts 43 and 44 and the voltmeter 33 or the like is connected to the contacts 43a and 44a to thereby detect the voltage.

As described above in the examples of the prior art, the charging apparatus shown in FIG. 4A needs the switching means 32 of large capacity to turn ON and OFF the current of large current value 1A to 2A in the rapid charging processing, and the switching means 32 which can endure such large current is not only expensive but also low in reliability. Furthermore, the charging apparatus of FIG. 4B is disadvantageous in space factor and in cost, and also, the voltage is detected while the inner resistance of the secondary battery is involved, which deteriorates accuracy in measuring the release voltage of the secondary battery.

OBJECTS AND SUMMARY OF THE INVENTION

Accordingly, it is an object of the present invention to provide an improved charging amount display apparatus which can eliminate the aforenoted shortcomings and disadvantages encountered with the prior art.

More specifically, it is an object of the present invention to provide a charging amount display apparatus in which a charging amount can be displayed by a simplified circuit arrangement utilizing only a charging current detecting circuit.

Another object of the present invention is to provide a charging amount display apparatus in which a voltage of a secondary battery can be detected with high accuracy.

Still another object of the present invention is to provide a charging amount display apparatus in which a charging time can be reduced considerably.

A further object of the present invention is to provide a charging amount display apparatus in which a circuit arrangement can be simplified.

As an aspect of the present invention, a charging apparatus is provided, in which a secondary battery is charged by a constant voltage and a charging amount is detected. This charging apparatus is characterized in that a voltage setting value for charging the secondary battery by the constant voltage is varied at every predetermined period and changes of current at the varied timing points are detected to detect the charging amount.

The above, and other objects, features and advantages of the present invention will become apparent in the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

Figure 6A:
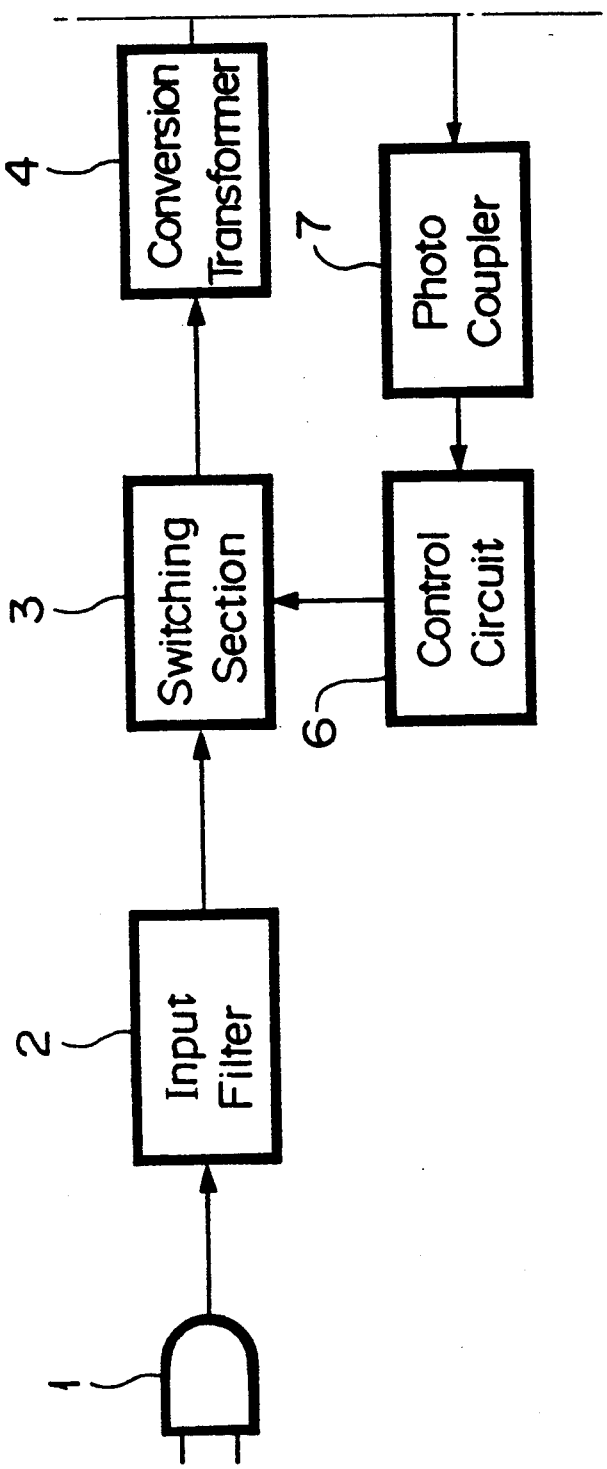
FIGS. 6A and 6B comprise a schematic block diagram showing a first embodiment of a charging amount display apparatus according to the present invention.
Figure 6B:
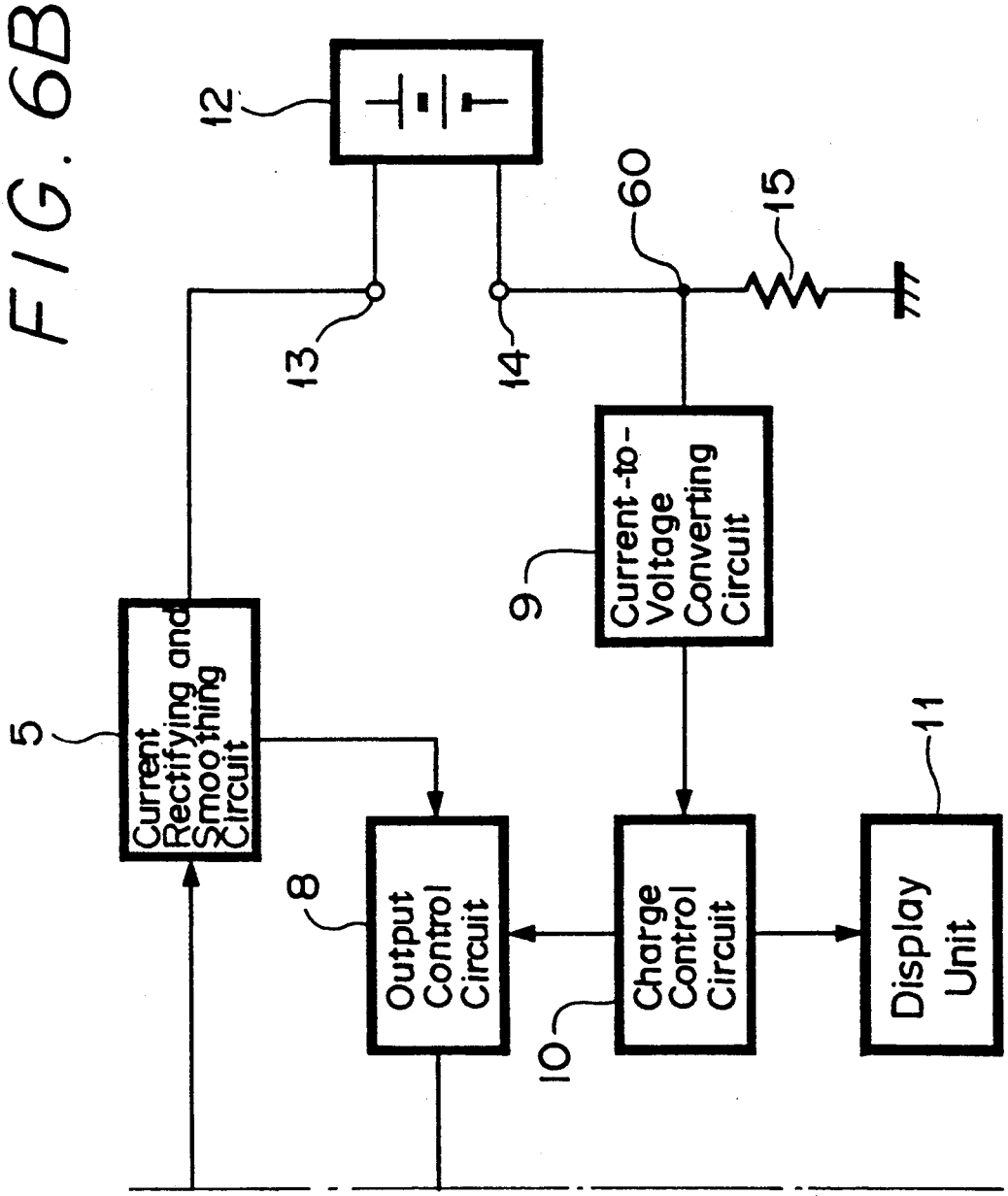
Figure 7A:
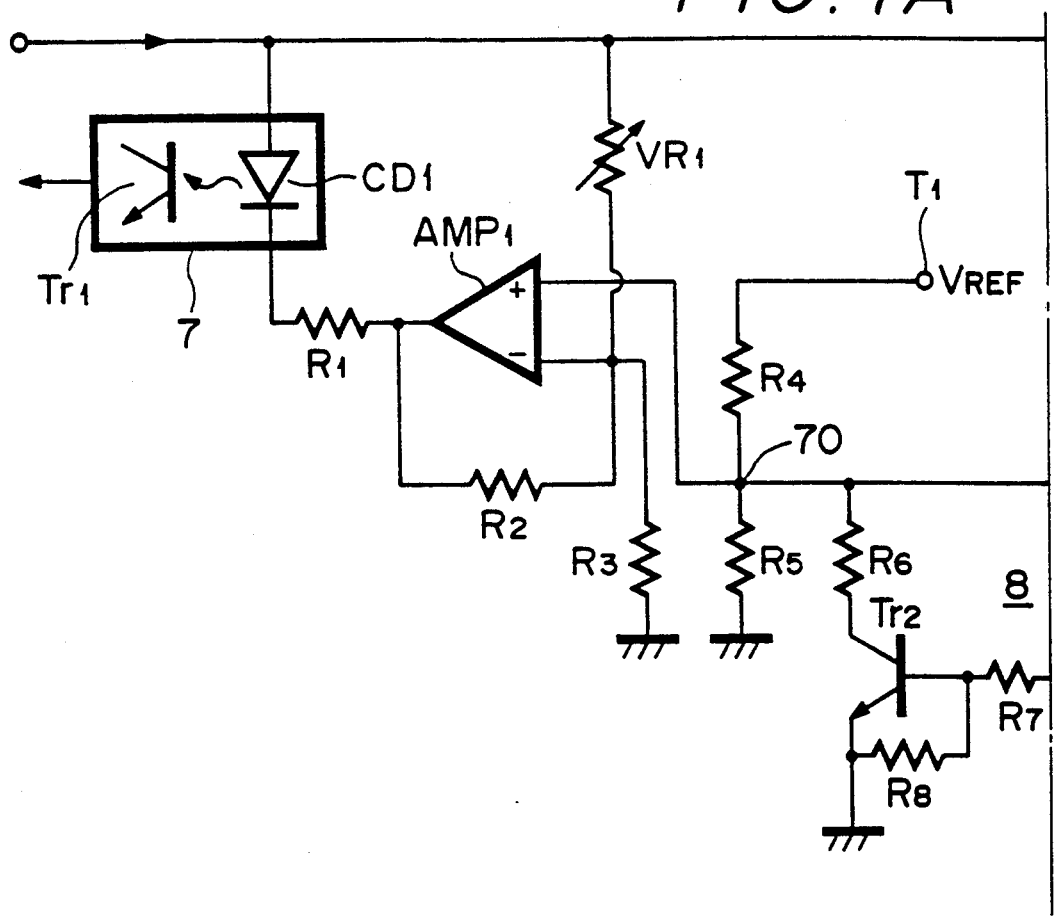
FIGS. 7A and 7B comprise a schematic circuit diagram showing a main portion of the charging amount display apparatus shown in FIGS. 6A and 6B.
Figure 7B:
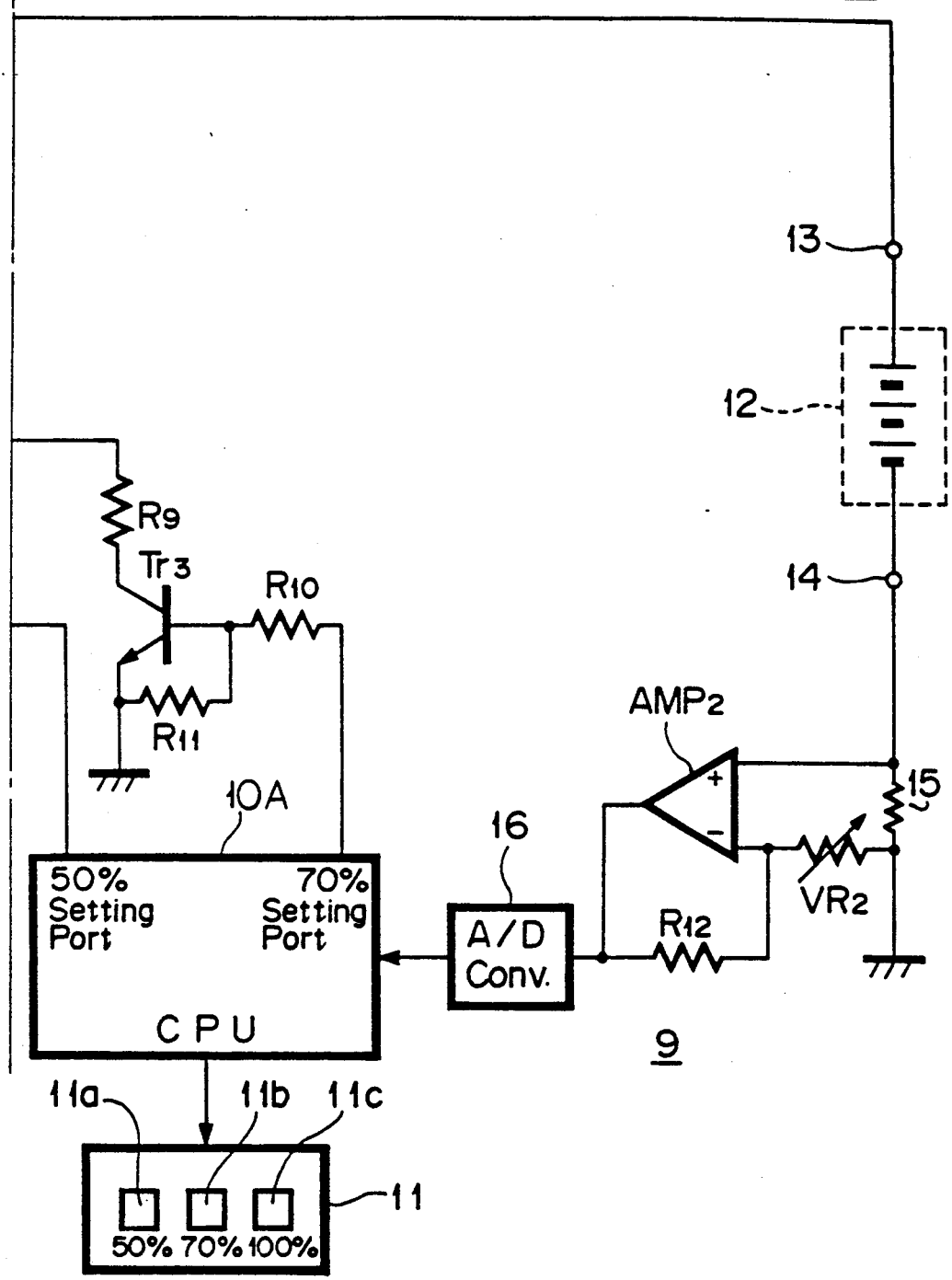
Figure 8:
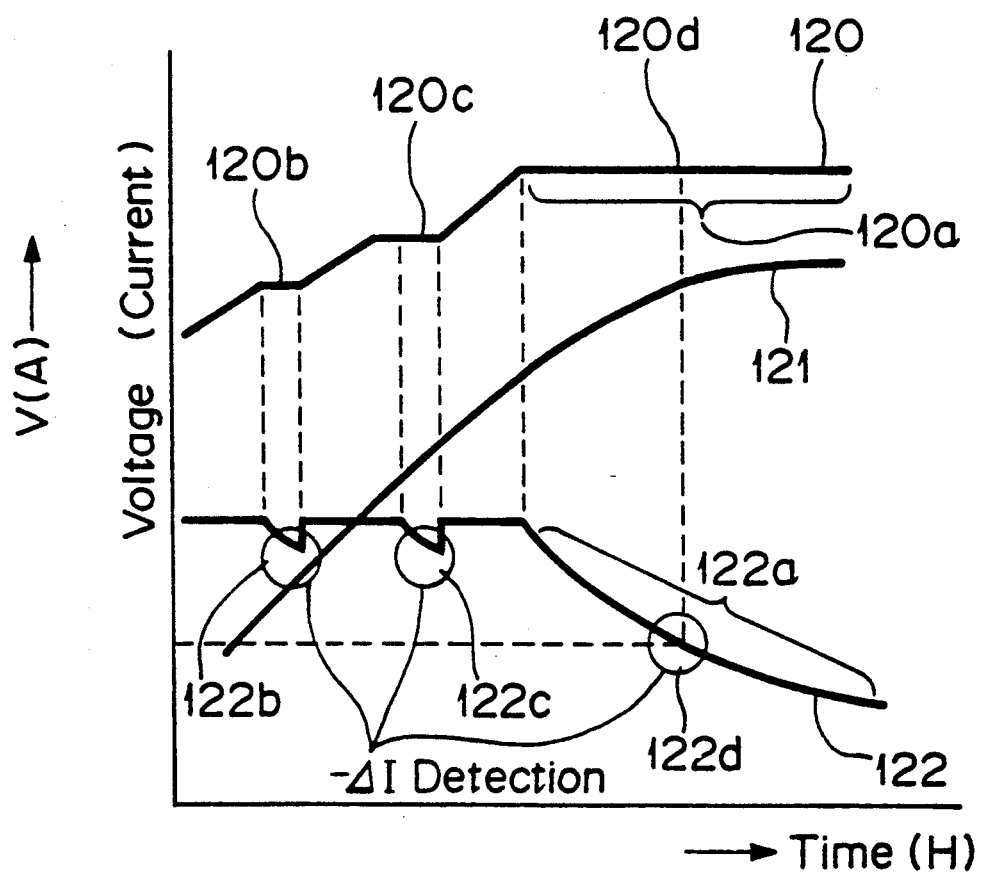
FIG. 8 is a graph of characteristics of time versus voltage and current, and to which references will be made in explaining operation of the charging amount display apparatus shown in FIGS. 6A-B and 7A-B.

A first embodiment of a charging amount display apparatus according to the present invention will hereinafter be described in detail with reference to FIGS. 6A-B to 8. FIGS. 6A-B comprise a systematic block diagram showing an overall arrangement of the first embodiment of the charging amount display apparatus according to the present invention. FIGS. 7A-B show a circuit diagram of a main portion of FIGS. 6A-B and illustrating the case that a charging control circuit is realized by a central processing unit (CPU), and FIG. 8 is a graph of charging characteristics used to explain operation of the charging amount display apparatus of the first embodiment.

Figure 1:
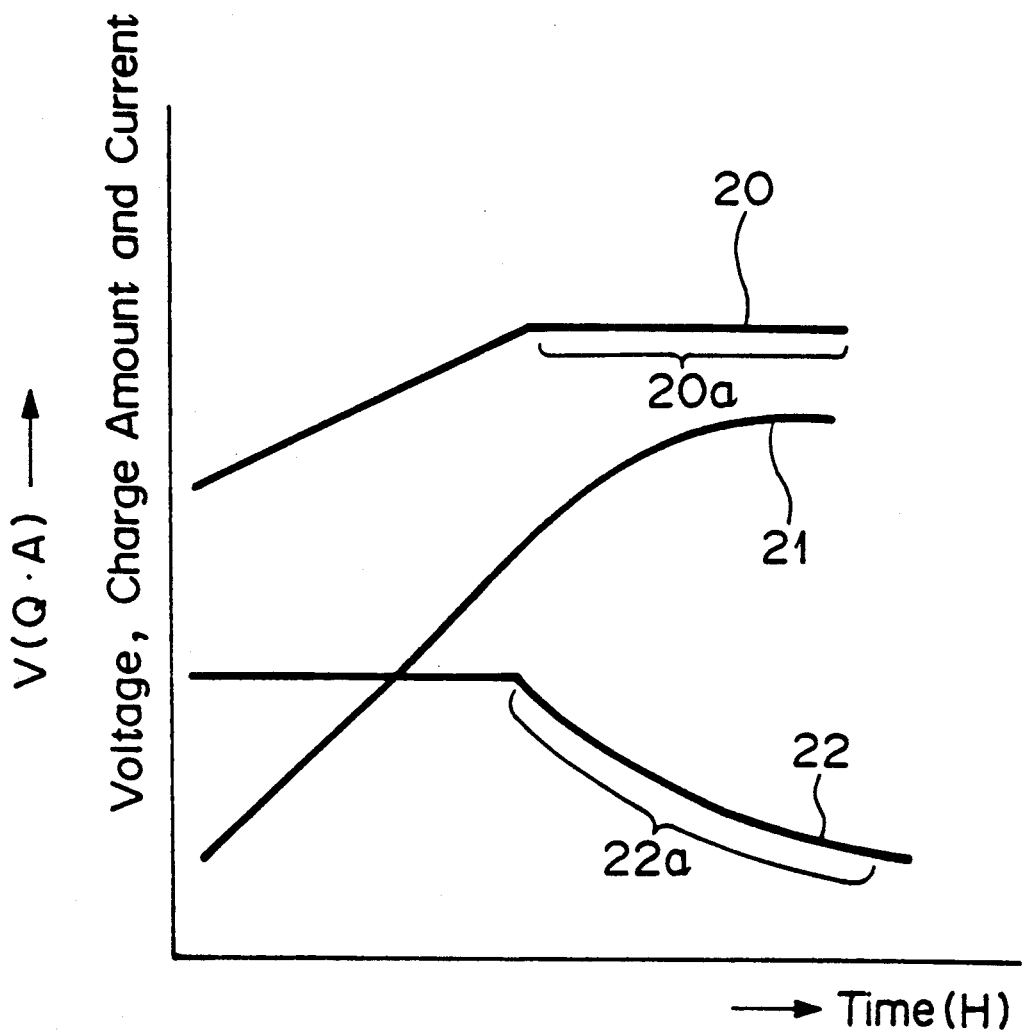
FIG. 1 is a graph of characteristics of voltage, charging amount, current versus time, and to which references will be made in explaining a conventional charging amount display apparatus of a secondary battery.
Figure 2:
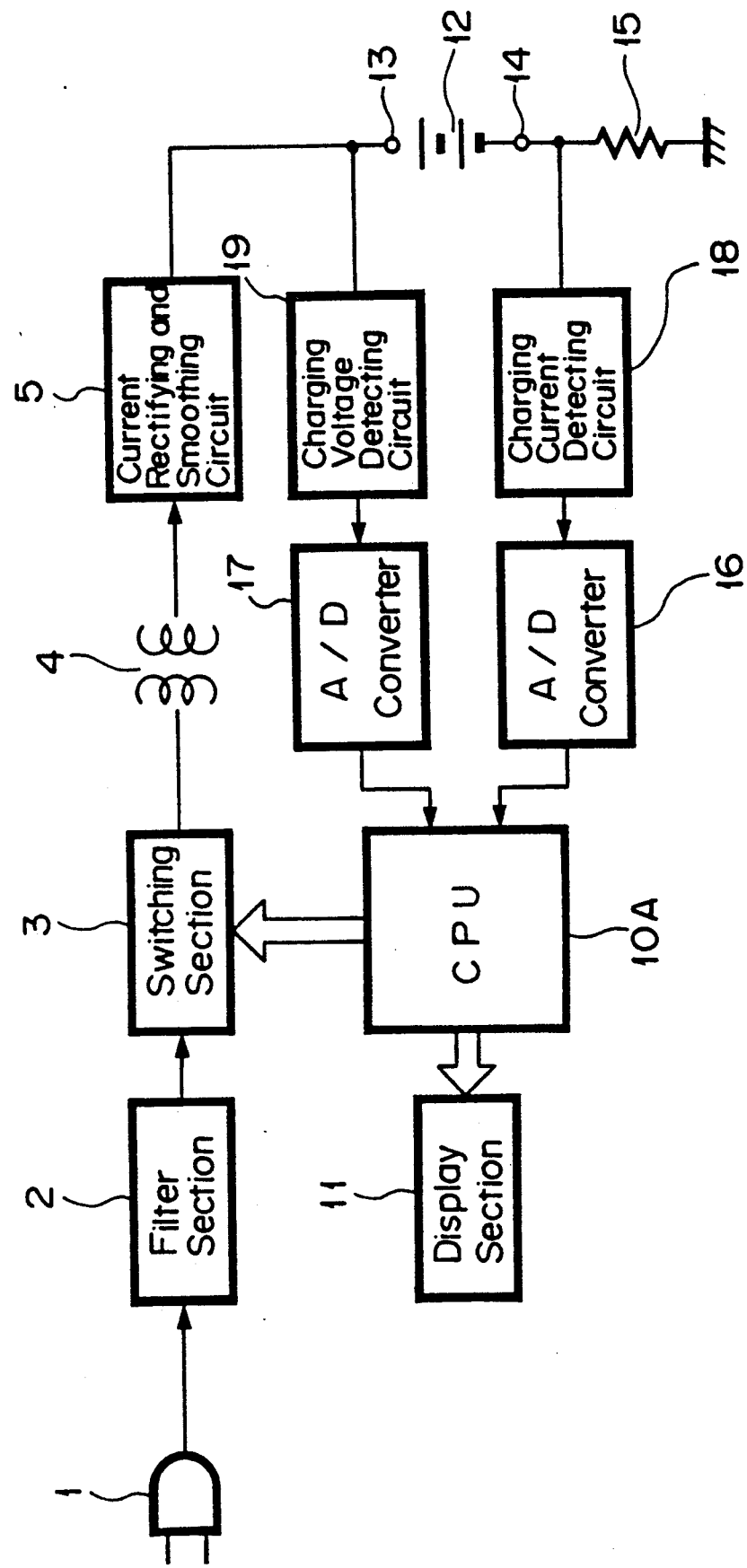
FIG. 2 is a schematic block diagram showing an example of the conventional charging amount display apparatus.
Figure 3:
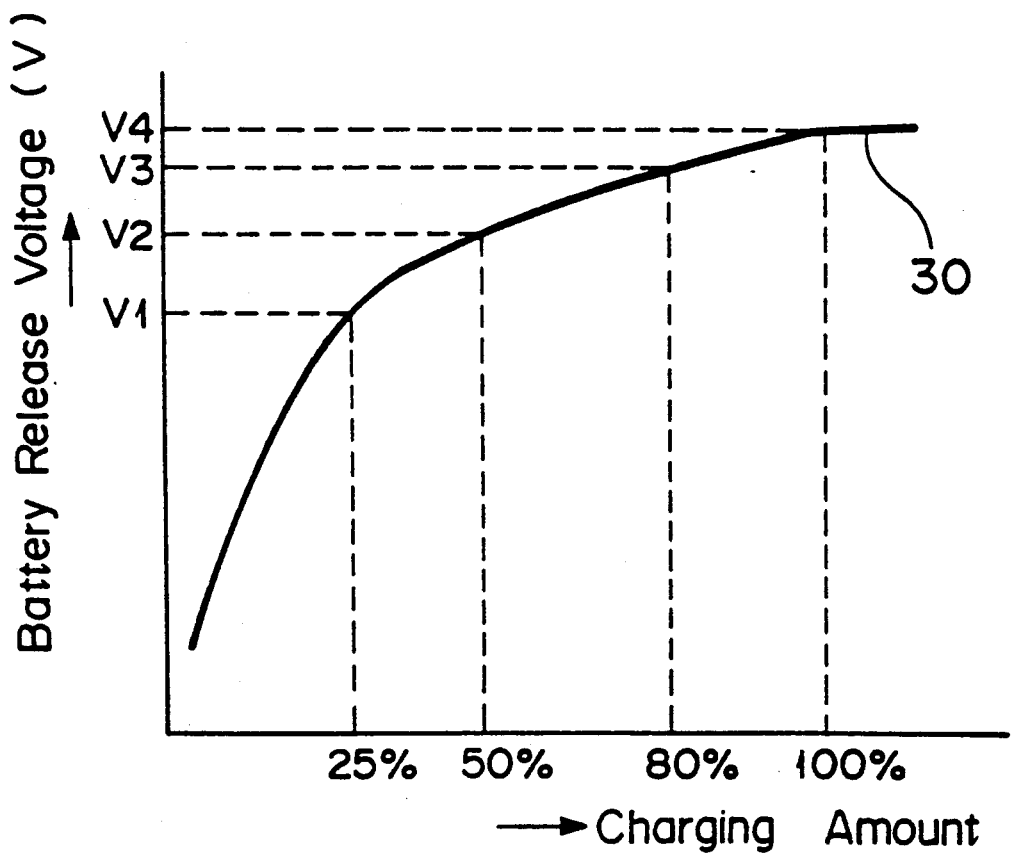
FIG. 3 is a graph of characteristics of charging amount versus battery release voltage, and to which references will be made in explaining another conventional charging apparatus of a secondary battery.

In this embodiment, like parts corresponding to those of the prior art shown in FIG. 2 are marked with the same references and therefore need not be described in detail.

As shown in FIGS. 6A-B, the AC voltage from the AC plug 1 inserted into the commercially available AC power supply source is converted into a DC voltage via the input filter 2, the switching section 3, the conversion transformer 4 and the rectifying and smoothing circuit 5 and supplied to the positive terminal 13 which is connected with the anode terminal of the secondary battery 12 such as the lead storage battery so as to be charged. A cathode terminal of the secondary battery 12 is connected to the negative terminal 14, and a charging current detection resistor 15 is connected between the negative terminal 14 and the ground. A charging current developed at a junction 60 between the charging current detection resistor 15 and the negative terminal 14 is supplied to a current-to-voltage converting circuit 9, in which the charging current is converted to a charging voltage and is fed to a charge control circuit 10. A display unit 11 is connected to the charge control circuit 10 and a charge control voltage from the charge control circuit 10 is supplied to an output control circuit 8. Accordingly, a reference voltage of the output voltage supplied from the rectifying and smoothing circuit 5 is switched by the output control circuit 8 in response to the charging control voltage. An output of this output control circuit 8 is supplied to a light emitting element (not shown) of a photo coupler 7. A light emitted from the light emitting element of the photo coupler 7 is converted into an electrical signal by a light receiving element and fed to the control circuit 6 to thereby control the switching timing of the switching section 3.

FIGS. 7A-B show an example of a specific circuit arrangement of the current-to-voltage converting circuit 9, the output control circuit 8 and the photo coupler 7 wherein the charge control circuit 10 is replaced with the CPU 10A. As shown in FIGS. 7A-B, the DC voltage from the rectifying and smoothing circuit 5 is supplied to an anode of a light emitting element CD1 such as a light emitting diode forming the photo coupler 7. A cathode of the light emitting element CD1 is connected to one end of a resistor R1 whose other end is connected to the output terminal of a voltage comparing operational amplifier AMP1. A light receiving element $Tr_1$ such as the photo transistor forming the photo coupler 7 is connected to the control circuit 6. An inverting input terminal of the operational amplifier $AMP_1$ is connected through a variable resistor VR1 to a signal line to which the DC voltage is supplied. A feedback resistor R2 is connected between the inverting input terminal of the operational amplifier AMP1 and the output of the operational amplifier AMP1, and a resistor R3 is connected between the inverting input terminal of the operational amplifier $AMP_1$ and the ground. A reference voltage $V_{REF}$ is supplied to a non-inverting input terminal of the operational amplifier $AMP_1$ from a reference terminal T1 through serially-connected dividing resistors R4 and R5, and one end of the resistor R5 is grounded. Collectors of transistors $Tr_2$ and $Tr_3$ constructing the output control circuit 8 are connected to a junction 70 between the dividing resistors R4 and R5 by way of resistors R6 and R9, and emitters of the transistors $Tr_2$ and $Tr_3$ are grounded, respectively. Also, resistors R8 and R11 are connected to the base-emitter path of the transistors $Tr_2$ and $Tr_3$, and bases of the transistors $Tr_2$ and $Tr_3$ are connected through base resistors R7 and R10 to, for example, 50% setting port and 70% setting portion of the CPU 10A, respectively.

The display unit 11 is controlled by the CPU 10A, and a light emitting diode (LED) 11a for 50% display unit is lit when the charging amount of 50% is set and the charge of the charging amount of 50% is effected. When the charging amount of 70% is set and the charging of the charging amount of 70% is effected, an LED 11b of 70% display unit is lit. In a like fashion, when the charging amount of 100% is set and the charging of the charging amount of 100% is effected, an LED 11c of 100% display unit is lit.

The secondary battery 12 such as the lead storage battery or lithium battery to be charged by constant voltage charging is connected between the positive and negative terminals 13 and 14, and the current-to-voltage converting circuit 9 is composed of a differential amplifier AMP2, a resistor R12 and a variable resistor VR2. A current across the charging current detection resistor 15 is supplied to the non-inverting and inverting input terminals of the differential amplifier AMP2 via the variable resistor VR2 and is thereby converted to a voltage. This voltage is supplied to an analog-to-digital converting circuit 16, in which it is converted into digital data and the charging voltage thus converted to the digital data is supplied to the CPU 10A. An operation of the thus constructed charging amount display apparatus of the present invention will be explained with reference to a charging characteristic graph forming FIG. 8. In this case, a circuit for making the charging current constant will not be described.

In this embodiment, the secondary battery 12 might be rechargeable batteries, such as the lead storage battery and the lithium battery which are charged by a constant voltage. If the secondary battery is charged by, for example, 10 V and 2 A, the CPU 10A initially sets the charging voltage at low voltage, for example, 5 V in accordance with a detection point of the charging amount. More specifically, in a range in which a charging voltage characteristic curve 120 is increased as shown in FIG. 8, the charging voltage is selected to be, for example, a setting voltage 120b of 5 V and 2 A of 50% of the saturation voltage. In that case, the 50% setting port 11a and the 70% setting port 11b are placed in the high level state so that the transistors $Tr_2$ and $Tr_3$ are turned ON. Although a constant charging current is flowed as shown by a charging current characteristic curve 122 in FIG. 8 until the secondary battery 12 reaches the 50% setting voltage, if the secondary battery 12 reaches the 50% setting voltage 120b, the constant current mode is changed to the constant voltage mode so that a charging current begins to decrease as shown by a characteristic curve 122b. $A - \Delta I$ at that time is detected by means of the charging current detection resistor 15 and fed to the current-to-voltage converting circuit 9, in which it is converted into a voltage. This voltage is converted to digital data and input to the CPU 10A. When the CPU 10A detects $-\Delta I$, the CPU 10A causes the LED 11a of the display unit 11 to light, indicating that the secondary battery 12 is fully charged to the 50% setting voltage. Next, the 50% setting port of the CPU 10A is set to low level so that the transistor $Tr_2$ is turned OFF. Then, a voltage at the non-inverting input terminal of the operational amplifier $AMP_1$ is changed by changing a dividing ratio of the reference voltage supplied to a reference voltage terminal T1. As described above, the light emission amount of the light emitting element $CD_1$ of the photo coupler 7 is changed and the switching timing of the switching section 3 is changed, whereby the charging voltage is set to a setting voltage 120c of 7 V and 2 A of 70% of the saturation voltage. Under this setting condition, the secondary battery 12 is charged one more time, and a charging current is flowed in the constant current mode as shown by the charging current characteristic curve 122 of FIG. 8. When the charging amount reaches the 70% setting charging amount, the constant current mode is changed to the constant voltage mode, and the charging current begins to decrease as shown by a characteristic curve 122c of FIG. 8. As a consequence, the CPU 10A detects $-\Delta I$ one more time and causes the display unit 11 to indicate that the secondary battery 12 is charged to the 70% setting voltage. Then, the 70% setting port of the CPU 10A is placed in low level so that the transistor $Tr_3$ is turned OFF, whereby the reference voltage of the operational amplifier $AMP_1$ is switched and the switching section 3 is switched at a predetermined timing. As described above, the CPU 10A shifts up the setting of the charging voltage so that the charging voltage reaches, for example, a charging voltage setting value where the charging voltage characteristic curve 120 enters a saturation region 120a shown in FIG. 8 and the charging voltage becomes constant. For example, in a setting voltage 120d of 10 V and 2 A, a charging current characteristic curve 122 lies within a decreasing region 122a. Therefore, under the condition that 100% charging of a final setting voltage is effected, $-\Delta I$ (122d) of the charging current is detected and the 100% LED 11c is lit. At that time, the CPU 10A turns OFF the transistors $Tr_2$ and $Tr_3$ and a voltage, which results from dividing the reference voltage $V_{REF}$ by the resistors R4 and R5, is supplied to the non-inverting input terminal of the operational amplifier $AMP_1$.

According to the above-mentioned embodiment, it is sufficient that $-\Delta I$ of the charging current is detected until the charging amount reaches the charging amount of 100%, which needs only the charging current detecting means. Therefore, in the control operation of the CPU 10A, only a single A/D converter circuit is needed and thus the circuit arrangement can be simplified considerably.

While the setting values are 50%, 70% and 100% in the above-mentioned embodiment, these setting values may be changed freely at proper intervals.

According to the charging amount display apparatus of the present invention, as compared with the prior art in which the charging current and the charging voltage ar both detected to display the charging condition, the charging amount can be displayed by detecting only the charging current so that the circuit arrangement can be simplified considerably.

Figure 9A:
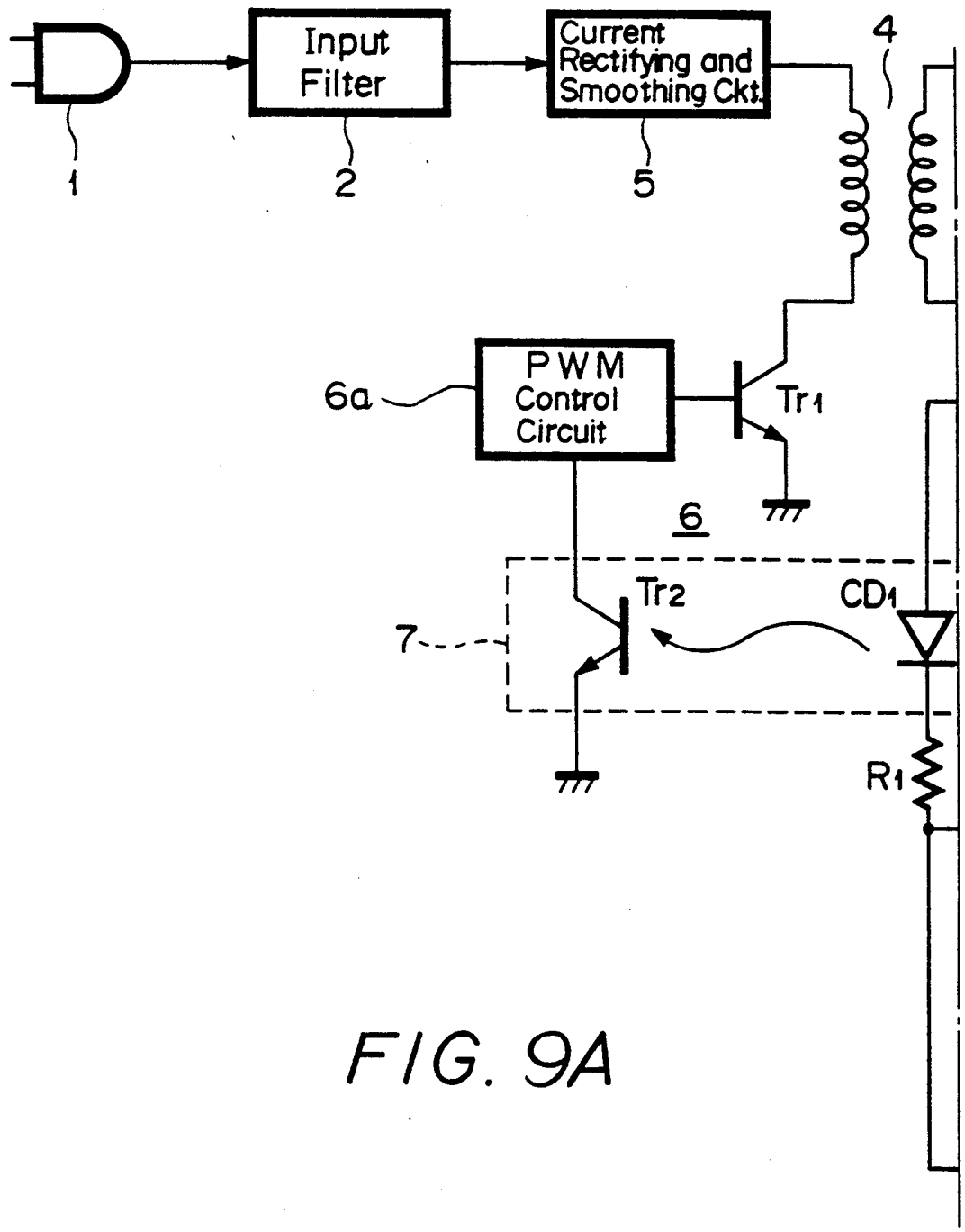
FIGS. 9A and 9B comprise a schematic circuit diagram of a second embodiment of the charging amount display apparatus according to the present invention and illustrating another example of the main portion of FIGS. 6A-B.
Figure 9B:
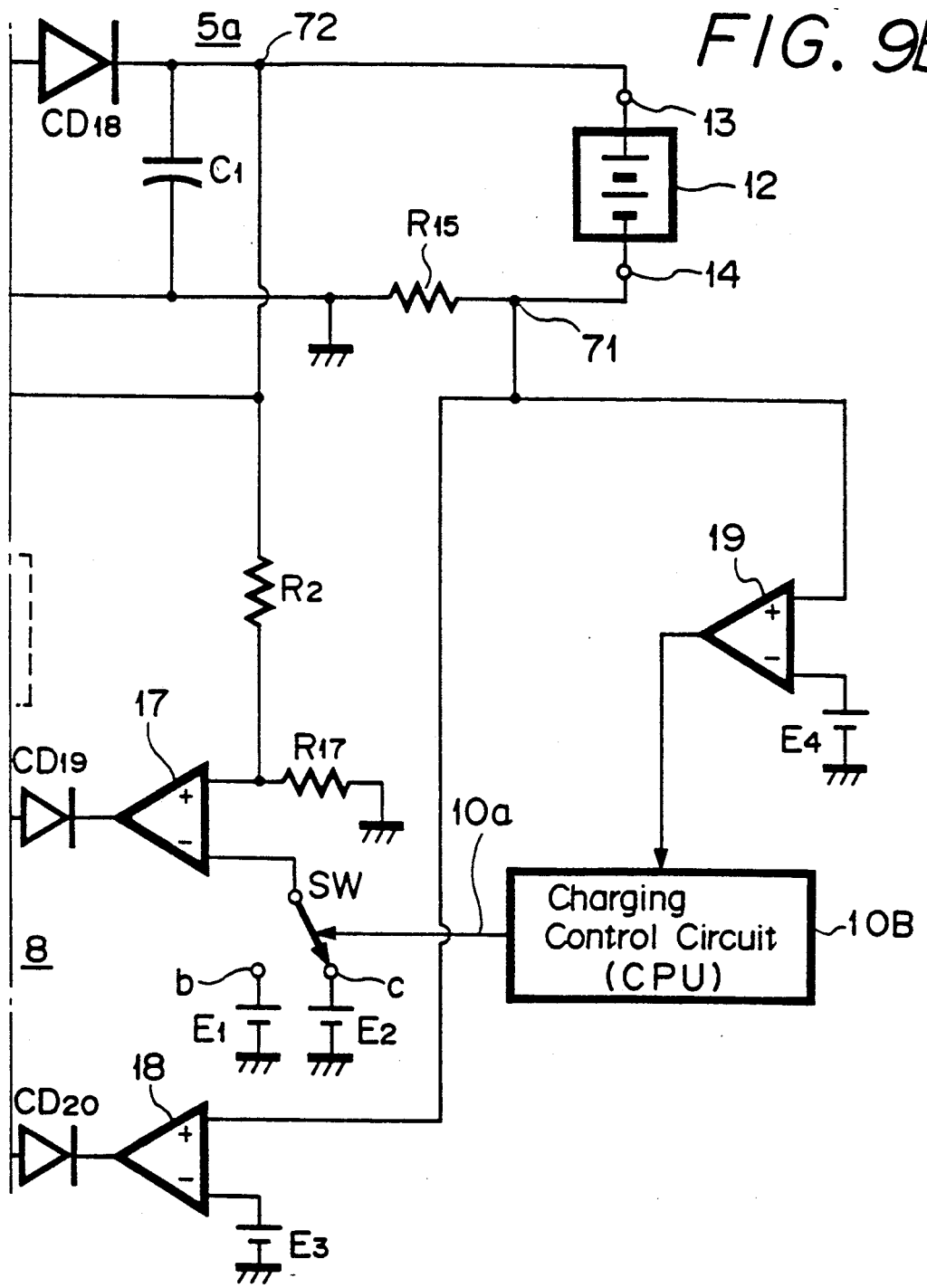

FIGS. 9A-B show another example of the specific circuit arrangement of the main portion of FIGS. 6A-B, and in FIGS. 9A-B, like parts corresponding to those of FIGS. 6A-B, and 7A-B are marked with the same references and therefore need not be described in detail.

Referring to FIGS. 9A-B, one end of the primary side winding of the conversion transformer 4 is connected to the rectifying circuit 5 and the other end thereof is connected to the collector of an output transistor $Tr_4$ which forms the control circuit 6. The emitter of the transistor $Tr_4$ is grounded and the base thereof is connected to an output terminal of a pulse width modulation control circuit (hereinafter referred to as a PWM control circuit) 6a. The collector of the transistor $Tr_1$ such as the photo transistor forming the photo coupler 7 is connected to the input terminal of the PWM control circuit 6a and the emitter thereof is grounded. A light from a light emitting element $CD_1$ formed of the light emission diode or the like forming the photo coupler 7 is supplied to the base of the transistor $Tr_1$. An anode of the light emitting element $CD_1$ is connected to the positive terminal 13 to which the anode of the secondary battery 12 to be charged is connected. A cathode of the light emitting element $CD_1$ is connected through the resistor R15 to anodes of diodes $CD_{19}$ and $CD_{20}$ the cathodes of which are respectively connected to output terminals of an output voltage error detecting operational amplifier 17 and an output current error detecting operational amplifier 18 forming the output control circuit 8.

A smoothing circuit 5a formed of the diode $CD_{18}$, a capacitor C1 or the like is provided at the secondary winding side of the conversion transformer 4. One end of its secondary winding is grounded and the other end thereof is connected to the anode of the diode $CD_{18}$. The cathode of the diode $CD_{18}$ is connected to one end of the capacitor C1 and is also connected to the positive terminal 13 to which the secondary battery 12 is connected. The other end of the capacitor C1 is grounded, and the charging current detection resistor 15 is connected to the negative terminal 14 to which the cathode of the secondary battery 12 is connected. One end of the resistor 15 is grounded, and a charging current developed at a junction 71 between the resistor 15 and the negative terminal 14 is supplied to non-inverting input terminals of the output current error detection operational amplifier 18 forming the constant current control means and the charging current detection operational amplifier 19. Reference current sources E3 and E4 are connected to the inverting input terminals of these operational amplifiers 18 and 19. A voltage developed at a junction 72 between the diode $CD_{18}$ and the positive terminal 13 is divided by the resistors R16 and R17 and fed to the non-inverting input terminal of the output voltage error detection operational amplifier 17 which forms the constant voltage control means. An inverting input terminal of the operational amplifier 17 is connected through a switch SW to, for example, two reference voltage sources E1 and E2. The number of the reference voltage sources E1 and E2 are not limited to two and a plurality of reference voltage sources may be properly provided in response to the number of the charging amount detection points as will described later. Further, the two reference voltage source E1 and E2 are not selectively switched by the switch SW, and alternatively, it is possible to provide a voltage varying means which continuously varies a voltage of one reference voltage source. The switch SW or the voltage varying means is controlled by the output of a CPU 10B. Though not shown, the CPU 10B incorporates therein a digital-to-analog converting means, an analog-to-digital converting means or the like, whereby the control signal which controls the switch SW is converted to an analog control signal and an analog charging current from the charging current detection operational amplifier 19 is converted to a digital signal and fed to the CPU 10B. The outputs of the operational amplifiers 17 and 18 are supplied to cathodes of the diodes $CD_{19}$ and $CD_{20}$, respectively.

Figure 10A:
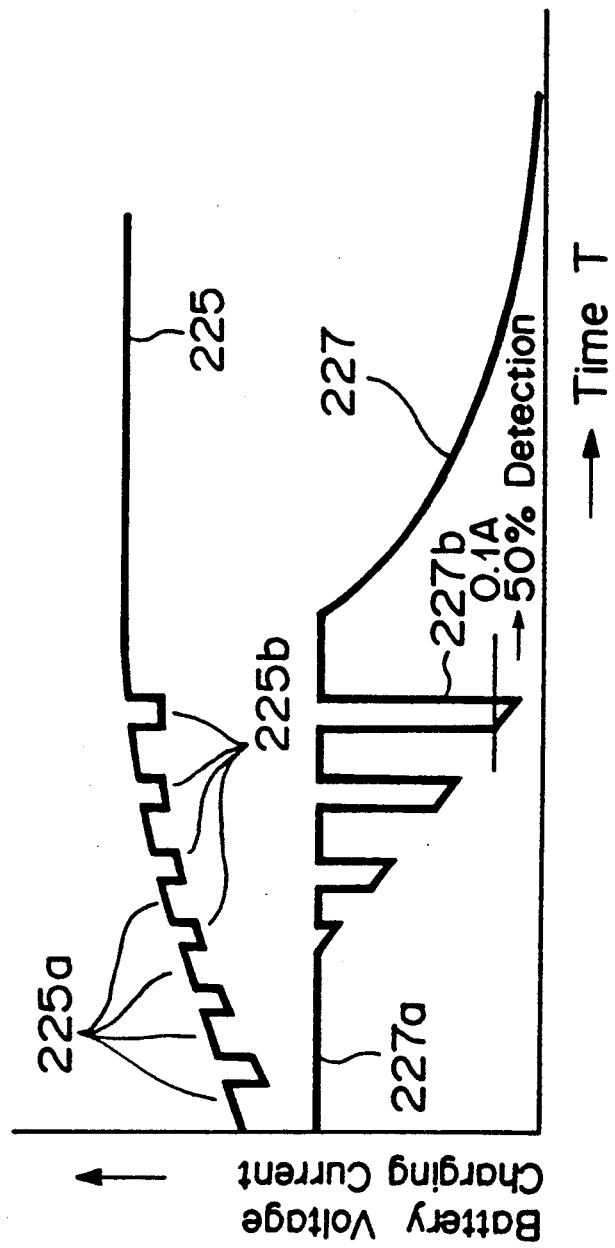
FIGS. 10A and 10B are respectively graphs of characteristics of time versus battery voltage and charging current used to explain operation of the circuit shown in FIGS. 9A-B.

An operation of the second embodiment of the present invention will now be described below with reference to characteristic graphs of FIGS. 10A and 10B.

Referring to FIGS. 9A-B, an AC voltage from the commercially available AC power supply source is converted to a DC voltage by means of the input filter 2, the rectifying circuit 5, the switching section 6, the conversion transformer 4 and the smoothing circuit 5a and this charging voltage is supplied to the secondary battery 12. The operational amplifier 18 compares the charging current flowing through the resistor 15 with the reference current of the reference current source E3, and an output error current from the operational amplifier 18 is supplied to the light emitting element $CD_1$ forming the photo coupler 7 through the diode $CD_{20}$ to drive the apparatus at a constant current in such a fashion that, as shown by a constant current curve 227a of a rapid charging current characteristic curve 227 in FIG. 10A, a constant current becomes 2 A. Similarly, the operational amplifier 17 compares the rectified DC voltage (output voltage) supplied to the secondary battery 12 with the reference voltage of the second reference voltage source E2, and supplies an output error voltage thereof to the light emitting element $CD_1$ forming the photo coupler 7 through the diode $CD_{19}$ to drive the apparatus at the constant voltage fashion such that, as shown by, for example, a rapid charging battery voltage characteristic curve 225, an output voltage 225a becomes 8.3 V.

The error signals of the two operational amplifiers 17 and 18 are supplied through the light receiving element $Tr_1$ to the PWM control circuit 6a connected to the primary winding side of the conversion transformer 4 by the photo coupler 7 so as to control the outputs of the charging voltage and the charging current to become constant via the conversion transformer 4. The operational amplifier 19 detects the charging current flowing through the charging resistor 15 and compares the detected charging current with the reference current of the reference current source E4 to thereby supply a very small charging current to the CPU 10B. The CPU 10B determines whether this very small charging current is less than a predetermined value, e.g., 0.1 A or not. In this embodiment, let it be assumed that the output voltage 225a supplied to the secondary battery 12 is 8.3 V when the voltage of the second reference voltage source E2 connected to a second fixed contact c of the switch SW connected to the inverting input terminal of the operational amplifier 17 is V2 volt. Also, let it be assumed that the battery release voltage is 7.5 V when the secondary battery 12 is charged by the charging amount of 50%. Then, the voltage of the first reference voltage source E1 at which the movable contact a of the switch SW is connected to a first fixed contact b is selected to be V1 volt and this voltage V1 of the first reference voltage source E1 is selected such that the output voltage 225b supplied to the secondary battery 12 becomes nearly equal to 7.5 V. In order to detect the detection voltage of the charging amount of 50% after the voltage of the first reference voltage source E1 is selected, the CPU 10B derives a control signal 10a which changes over the switch SW at a predetermined cycle as shown in FIG. 10A. As a consequence, the smoothing circuit 5a derives the output voltage 225b and 225a in which V1=7.5 V and V2=8.5 V are established.

When the output voltage 225b is 7.5 V (the reference voltage source E1 side), the operational amplifier 19 detects the charging current and the detected charging current is supplied to the CPU 10B. If the charging current is higher than 0.1 A (of course, the charging current might be higher than 0 A), the CPU 10B changes the movable contact a of the switch SW to the V2 volt (output voltage 8.5 V) side of the reference voltage source E2 side to thereby charge the secondary battery 12 by a charging current 2 A during a predetermined period of time. After a predetermined period of time, when the movable contact a of the switch SW is switched again to the fixed contact b to which the reference voltage source E1 is connected, if the CPU 10B examines the charging current detected by the operational amplifier 19 under the condition that the output voltage is 7.5 V and detects a charging current 227b shown in FIG. 10A in which the charging current becomes less than 0.1 A, then a detected value becomes the battery release voltage 7.5 V=output voltage 7.5 V in the 50% charging process. More specifically, as shown by a rapid charging current characteristic curve 227 of FIG. 10A, the charging current of the battery release voltage of 7.5 V in the 50% charging process is gradually decreased from 2 A and when it is decreased up to the charging current of 0.1 A, it can be determined that the secondary battery 12 is charged by the 50% charging mode. Also, when a plurality of charging amounts, such as 30% charging amount, 70% charging amount and so on are detected in addition to the detection of the 50% charging amount, the voltage of the reference voltage source E2 is set to a predetermined value and the switch SW is switched properly, similarly as described above.

According to the above-mentioned arrangement, the charging amount detection voltage in the charging process of a predetermined charging amount (%) is set and it is determined whether the charging current at this setting voltage becomes zero or becomes the very small charging current. Therefore, if the very small current is 0.1 A similarly to the second embodiment, even when the contact resistance is considerably changed to 200 mΩ, 0.1 A×200 mΩ=0.02 V is established. Thus, as compared with the case that the charging current 2 A is switched, a secondary battery voltage detection accuracy can be increased by about 20 times.

Further, when the output voltage is repeatedly changed as 7.5 V and 8.5 V at a predetermined cycle, a charging time for effecting the 50% charging amount can be reduced.

Figure 10B:
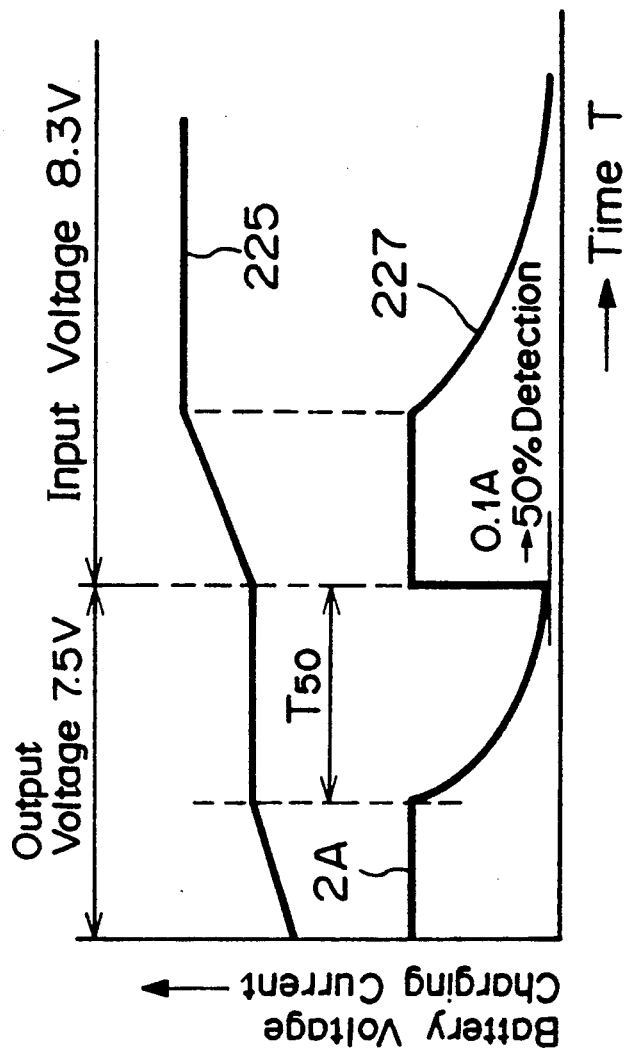

For example, let it be assumed that the characteristic of the secondary battery is the rapid charging battery voltage characteristic curve 225 and the rapid charging current characteristic curve 227 shown in FIG. 10B. Then, the charging time is similar to that of the charging method shown in FIG. 10A when the charging current is 2 A, and it takes a lot of time when the charging current is decreased and the current is lowered up to 0.1 A. Accordingly, if the secondary battery is charged by the charging voltage higher than 7.5 V, i.e., 8.5 V until the charging current begins to decrease and reaches 0.1 A, then the charging current is recovered to the charging current 2 A. As a consequence, a time $T_{60}$ of FIG. 10B can be considerably reduced by the time in which the charging voltage is selected to be 8.5 V.

Figure 4A:
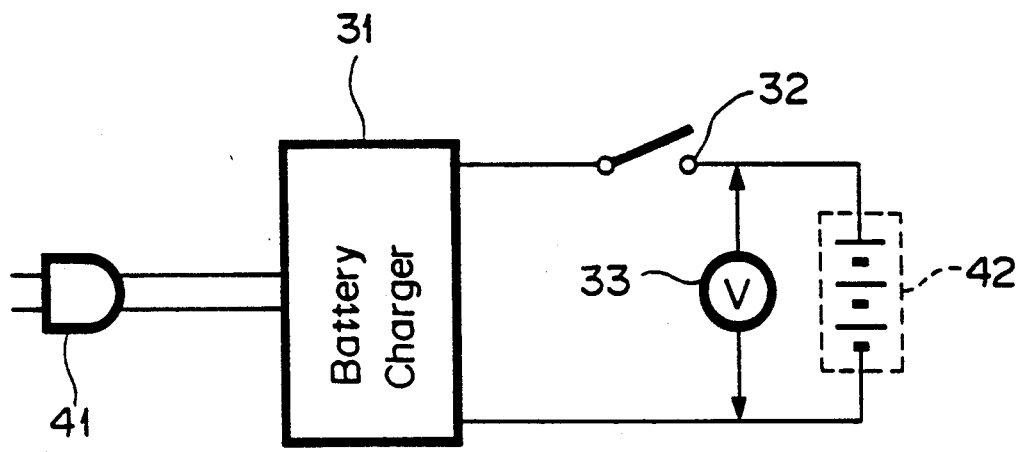
FIGS. 4A and 4B are schematic diagrams showing examples of conventional charging amount display apparatus, respectively.
Figure 4B:
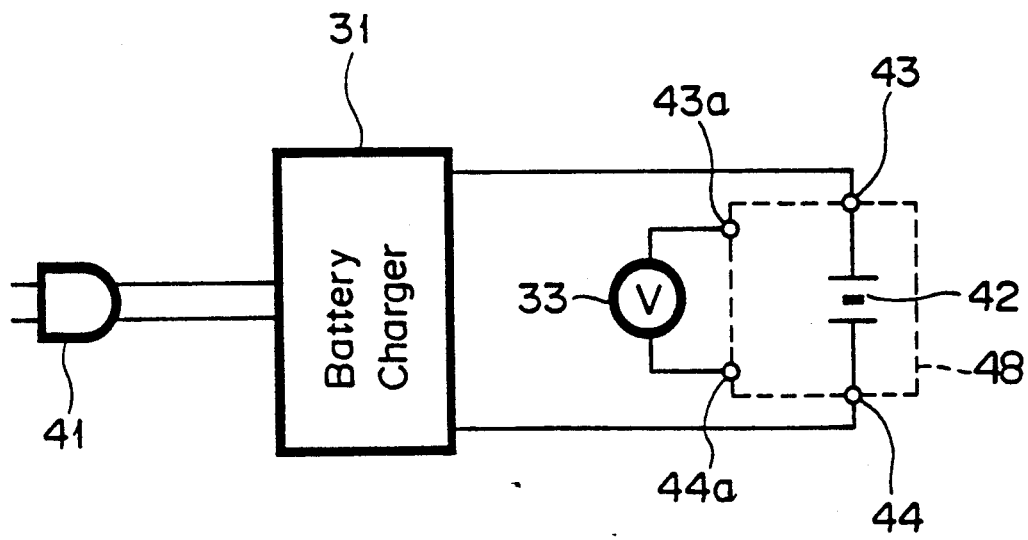
Figure 5:
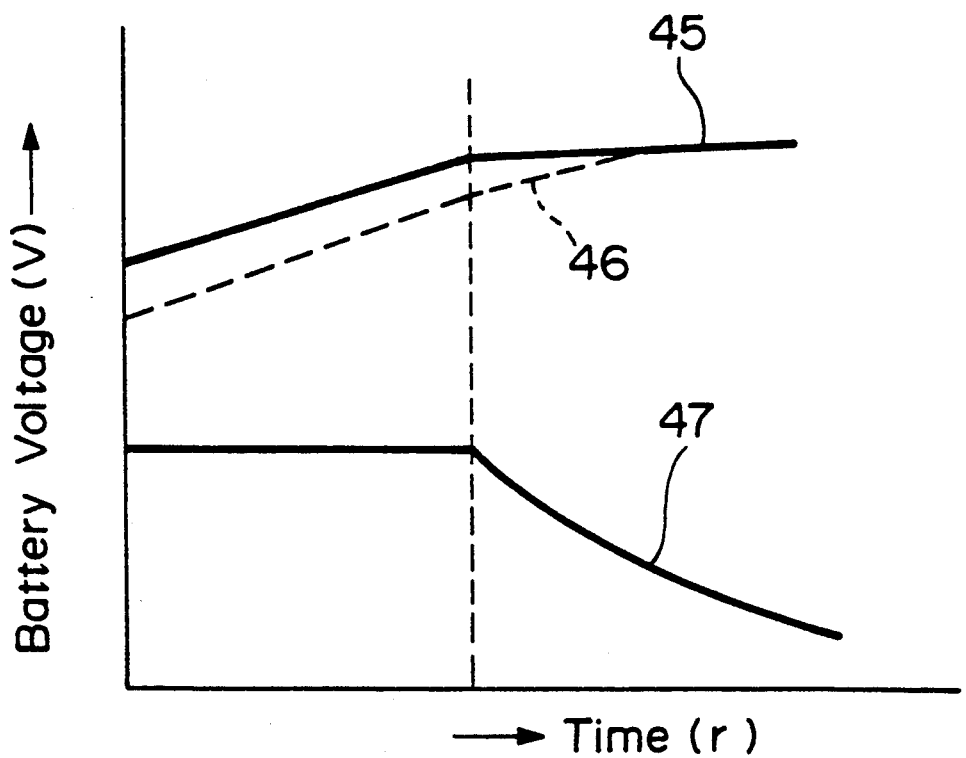
FIG. 5 is a graphs of characteristics of time versus battery voltage, and to which references will be made in explaining operation of the conventional charging amount display apparatus shown in FIGS. 4A and 4B.

According to the arrangement of the second embodiment, the switching means of large current capacity shown in FIGS. 4A and 4B are not needed and detection accuracy in detecting the battery voltage can be increased.

Further, while the battery voltage measuring circuit and the charging current detecting circuit for detecting the end of charging operation are both required in order to detect the release voltage of the secondary battery and to detect or display the charging amount in the prior art, according to the second embodiment of the present invention, a circuit for detecting a voltage is not needed because the output voltage is merely set and only the charging current detecting circuit of the operational amplifier 19 is required. Also, the charging amount can be detected by the charging current detecting circuit which detects the end of the charging operation so that the circuit arrangement can be simplified.

According to the charging amount display apparatus of the present invention, the battery voltage can be detected with high accuracy and the circuit arrangement can be simplified considerably.

Having described preferred embodiments of the invention with reference to the accompanying drawings, it is to be understood that the invention is not limited to those precise embodiments and that various changes and modifications thereof could be effected by one skilled in the art without departing from the spirit or scope of the novel concepts of the invention as defined in the appended claims.

We claim as our invention:

1. A charging apparatus in which a secondary battery is charged by a constant voltage and a charging level is detected, comprising:

charging voltage means for selectively producing battery charging voltages of different voltage levels;

voltage setting means for selecting a voltage setting value in said charging voltage means for charging said secondary battery by successive, different constant voltage levels and detecting means for detecting changes of current at said different constant voltage levels and producing an output indicating the charging amount for controlling said voltage setting means.

2. A charging apparatus according to claim 1, wherein said voltage setting means for selecting the voltage setting value includes control means for selecting said constant voltage levels in a sequential order of increasing levels.

3. A charging apparatus according to claim 1, wherein said voltage setting means for selecting the voltage setting value includes switch means for switching between a rapid charging setting value and a setting value for measuring a terminal voltage of the battery, and said charging amount is detected by said detecting means when said voltage setting value is switched to said setting value for measuring the terminal voltage of the battery.

4. A charging apparatus according to claim 3, further comprising voltage error detecting means for comparing an output voltage of the charging apparatus and a reference voltage and controlling said charging voltage means for charging said secondary battery by the constant voltage.

5. A charging apparatus according to claim 4, further comprising current error detecting means for comparing an output current of the charging apparatus and a reference current and controlling said charging voltage means for charging said secondary battery by the constant current and cooperating with said voltage error detecting means for charging said secondary battery by the constant voltage.

6. A charging apparatus according to claim 5, wherein when said voltage setting value in said voltage setting means is switched by said switch means when said voltage error detecting means is switched between different reference voltages.

* * * * *